United States Patent
Yoon et al.

(10) Patent No.: US 10,770,680 B2
(45) Date of Patent: Sep. 8, 2020

(54) ORGANIC LIGHT-EMITTING DIODE DISPLAY

(71) Applicant: Samsung Display Co., Ltd., Yongin-si, Gyeonggi-do (KR)

(72) Inventors: Ho Jin Yoon, Hwaseong-si (KR); Byoung Ki Kim, Seoul (KR); Dae Woo Lee, Hwaseong-si (KR); Yun-Mo Chung, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 113 days.

(21) Appl. No.: 14/946,652

(22) Filed: Nov. 19, 2015

(65) Prior Publication Data

US 2016/0308163 A1    Oct. 20, 2016

(30) Foreign Application Priority Data

Apr. 14, 2015   (KR) .................... 10-2015-0052481

(51) Int. Cl.
*H01L 51/52*      (2006.01)
*H01L 27/32*      (2006.01)

(52) U.S. Cl.
CPC ...... *H01L 51/5253* (2013.01); *H01L 27/3246* (2013.01); *H01L 51/524* (2013.01); *H01L 51/5259* (2013.01); *H01L 2251/5315* (2013.01)

(58) Field of Classification Search
CPC ............ H01L 51/5246; H01L 51/524; H01L 51/5253; H01L 51/5259; H01L 27/3246; H01L 2251/5315
See application file for complete search history.

(56) References Cited

U.S. PATENT DOCUMENTS

2003/0025118 A1* 2/2003 Yamazaki ............ H01L 51/529
                                                                257/79
2004/0079941 A1* 4/2004 Yamazaki ............ H01L 51/56
                                                                257/40

(Continued)

FOREIGN PATENT DOCUMENTS

CN           1905207 A       1/2007
CN         102347346 A       2/2012

(Continued)

OTHER PUBLICATIONS

Chinese Patent Application No. 201610213560.4—Office Action dated Feb. 3, 2020.

(Continued)

*Primary Examiner* — Vongsavanh Sengdara
(74) *Attorney, Agent, or Firm* — F. Chau & Associates, LLC

(57) ABSTRACT

An organic light-emitting diode (OLED) display is disclosed. In one aspect, the OLED display includes a substrate including a display area in which an OLED is formed and a non-display area surrounding the display area. The OLED display also includes a pixel defining layer formed over the substrate and having an opening defining an emission area of the OLED, a first passivation layer covering a portion of the pixel defining layer formed in the non-display area and a second passivation layer formed in the non-display area, wherein a portion of the second passivation layer does not overlap the first passivation layer in the depth dimension of the OLED display. The OLED display further includes an encapsulation substrate formed to be opposite to the substrate and a filler filling a space between the substrate and the encapsulation substrate and contacting the first and second passivation layers.

22 Claims, 5 Drawing Sheets

(56) References Cited

U.S. PATENT DOCUMENTS

| | | | |
|---|---|---|---|
| 2011/0001146 A1* | 1/2011 | Yamazaki | H05B 33/10 |
| | | | 257/79 |
| 2014/0131683 A1* | 5/2014 | Kim | H01L 51/5253 |
| | | | 257/40 |
| 2015/0021564 A1 | 1/2015 | Hong et al. | |

FOREIGN PATENT DOCUMENTS

| | | |
|---|---|---|
| CN | 103887440 A | 6/2014 |
| CN | 104377224 A | 2/2015 |
| JP | 2009-049001 | 3/2009 |
| JP | 2014-032951 | 2/2014 |
| KR | 10-2005-0013853 A | 2/2005 |
| KR | 10-1107158 B1 | 1/2012 |
| KR | 10-1107160 B1 | 1/2012 |
| KR | 10-2013-0041806 A | 4/2013 |
| KR | 10-2014-0071552 A | 6/2014 |
| WO | WO2010004865 A1 | 1/2010 |

OTHER PUBLICATIONS

Japanese Patent Application No. 2016-077902—Office Action dated Mar. 3, 2020.

* cited by examiner

ORGANIC LIGHT-EMITTING DIODE DISPLAY

RELATED APPLICATIONS

This application claims priority to and the benefit of Korean Patent Application No. 10-2015-0052481 filed in the Korean Intellectual Property Office on Apr. 14, 2015, the entire contents of which are incorporated herein by reference.

BACKGROUND

Field

The described technology generally relates to an organic light-emitting diode display.

Description of the Related Technology

An organic light emitting diode (OLED) display does not need a separate light source and therefore may have reduced thickness and weight. In addition, OLED displays have favorable characteristics such as low power consumption, high luminance, and a high reaction speed.

A typical OLED display includes a substrate, a driving circuit unit formed and an OLED, which are formed on the substrate, a pixel defining layer which defines an emission area of the OLED, and an encapsulation substrate formed to be opposite to the substrate. The substrate and the encapsulation substrate are integrally bonded to each other by a sealant and a space between the substrate and the encapsulation substrate may be filled with a filler. The filler serves to increase stiffness of the OLED display so as to enhance durability.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect relates to an OLED display that can prevent defects, such as a pixel contraction, due to a filler.

Another aspect is an OLED display that can suppress the occurrence of defects such as pixel contraction by blocking various impurities, oxygen, or the like, included in a filler from permeating into an OLED through a pixel defining layer and a planarization layer.

Another aspect is an OLED display including: a substrate including a display area in which an OLED is formed and a non-display area outside the display area; a pixel defining layer formed on the substrate and including an opening defining an emission area of the OLED; a first passivation layer covering a surface of a portion formed in the non-display area, in the pixel defining layer; a second passivation layer formed outside the pixel defining layer in the non-display area; an encapsulation substrate formed to be opposite to the substrate; and a filler filling a space between the substrate and the encapsulation substrate and contacting the first passivation layer and the second passivation layer.

An end of the pixel defining layer may be positioned between an edge of the display area and an edge of the filler on a plane. The second passivation layer may contact the first passivation layer.

The OLED display may further include: a planarization layer formed under the pixel defining layer and the second passivation layer. The second passivation layer may cover the entire surface of the planarization layer outside the pixel defining layer. The pixel defining layer and the passivation layer may include silicon-based polymer.

The planarization layer may form an opening to expose an interlayer insulating layer under the planarization layer and the second passivation layer may cover the exposed interlayer insulating layer.

The OLED may include a pixel electrode, an emission layer, and a common electrode and may be covered with a capping layer. The first passivation layer may contact the common electrode and may be made of the same material as the common electrode. The second passivation layer may contact the first passivation layer and may be made of the same material as the pixel electrode.

The first passivation layer may contact the capping layer and may be made of the same material as the capping layer. The second passivation layer may contact the first passivation layer and may be made of the same material as the pixel electrode. The second passivation layer may be formed of a multilayer of a first transparent layer, a metal thin layer and a second transparent layer.

The first passivation layer may contact the capping layer and may be made of the same material as the capping layer and the second passivation layer may contact the first passivation layer and may be made of the same material as the capping layer.

Another aspect is an organic light-emitting diode (OLED) display, including: a substrate including a display area in which an OLED is formed and a non-display area surrounding the display area; a pixel defining layer formed over the substrate and having an opening defining an emission area of the OLED; a first passivation layer covering a portion of the pixel defining layer formed in the non-display area; a second passivation layer formed in the non-display area, wherein a portion of the second passivation layer does not overlap the first passivation layer in the depth dimension of the OLED display; an encapsulation substrate formed to be opposite to the substrate; and a filler filling a space between the substrate and the encapsulation substrate and contacting the first and second passivation layers.

In the above OLED display, an end of the pixel defining layer is positioned between an edge of the display area and an edge of the filler on a plane. In the above OLED display, the second passivation layer contacts the first passivation layer. The above OLED display further comprises: a planarization layer formed below the pixel defining layer and the second passivation layer, wherein the second passivation layer covers substantially the entire surface of the planarization layer outside the pixel defining layer. In the above OLED display, each of the pixel defining layer and the passivation layer is formed of silicon-based polymer. In the above OLED display, the planarization layer forms an opening to expose an interlayer insulating layer formed below the planarization layer and wherein the second passivation layer covers the exposed interlayer insulating layer.

In the above OLED display, the OLED includes a pixel electrode, an emission layer, and a common electrode and is covered with a capping layer. In the above OLED display, the first passivation layer contacts the common electrode and is formed of the same material as the common electrode. In the above OLED display, the second passivation layer contacts the first passivation layer and is formed of the same material as the pixel electrode. In the above OLED display, the first passivation layer contacts the capping layer and is formed of the same material as the capping layer. In the above OLED display, the second passivation layer contacts the first passivation layer and is formed of the same material as the pixel electrode. In the above OLED display, the second passivation layer is formed of a multilayer of a first transparent layer, a metal thin layer, and a second transparent layer.

In the above OLED display, the second passivation layer is formed of a multilayer of a first transparent layer, a metal thin layer, and second transparent layer. In the above OLED display, the first passivation layer contacts the capping layer and is formed of the same material as the capping layer and wherein the second passivation layer contacts the first passivation layer and is formed of the same material as the capping layer. In the above OLED display, the first and second passivation layers are formed on different layers. In the above OLED display, the first passivation layer is formed above the second passivation layer.

Another aspect is an organic light-emitting diode (OLED) display, including: an OLED formed in a display area; a pixel defining layer including a first portion formed in the display area and a second portion formed in a non-display area surrounding the display area; a first passivation layer covering at least the second portion of the pixel defining layer; a second passivation layer formed in the non-display area, wherein the second passivation layer contacts a portion of the first passivation layer and part of the second portion of the pixel defining layer; and a filler covering the first and second passivation layers.

In the above OLED display, the second passivation layer includes a portion that does not overlap the first passivation layer in the depth dimension of the OLED display. In the above OLED display, the first passivation layer includes a non-linear portion, and wherein the second passivation layer is substantially linear. In the above OLED display, the first and second passivation layers are formed on different layers.

According to at least one of the disclosed embodiments, it is possible to prevent various impurities, oxygen, and the like which are included in the filler from diffusing into the pixel defining layer and the planarization layer by allowing the first and second passivation layers to block the contact between the pixel defining layer and the planarization layer and the filler. It is possible to suppress the defects, such as the deterioration in the OLED and the pixel contraction, due to the filler.

DETAILED DESCRIPTION OF CERTAIN INVENTIVE EMBODIMENTS

Figure 1:
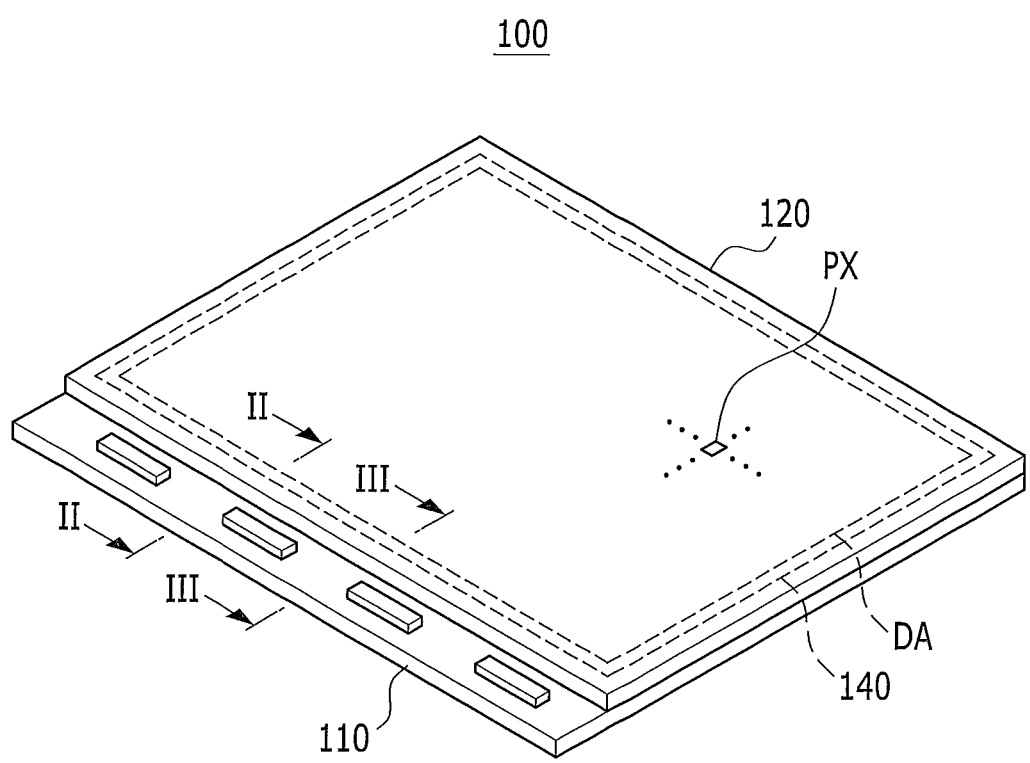
FIG. 1 is a perspective view of an OLED display according to a first exemplary embodiment.

Hereinafter, the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Throughout the present specification, it will be understood that when an element such as a layer, a film, a region, or a substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

In addition, unless explicitly described to the contrary, the word "comprise" and variations such as "comprises" or "comprising", will be understood to imply the inclusion of stated elements but not the exclusion of any other elements. In addition, the size and thickness of each configuration shown in the drawings are arbitrarily shown for understanding and ease of description, but the present disclosure is not limited thereto. In this disclosure, the term "substantially" includes the meanings of completely, almost completely or to any significant degree under some applications and in accordance with those skilled in the art. The term "connected" can include an electrical connection.

Figure 2:
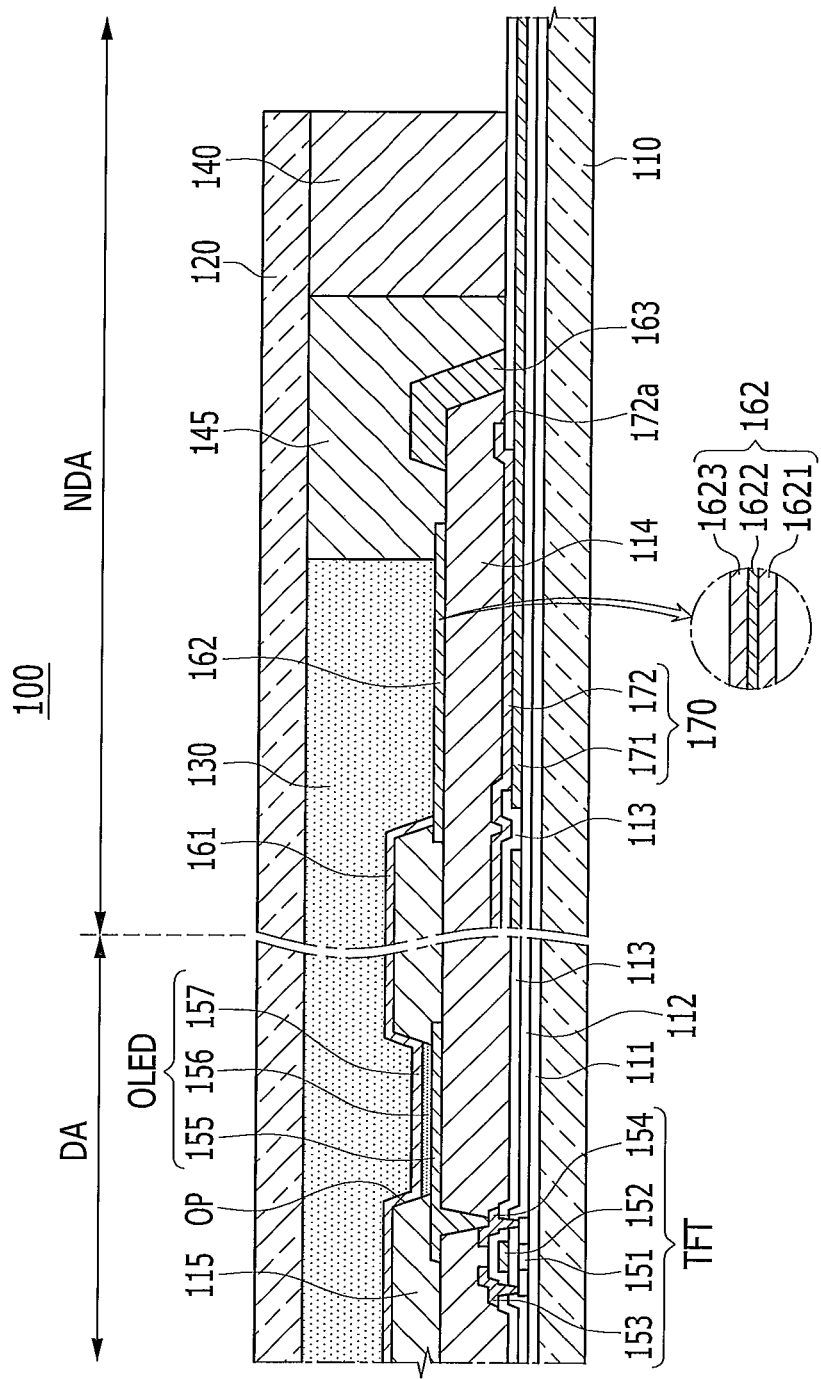
FIG. 2 is a partially enlarged cross-sectional view of the OLED display taken along the line II-II of FIG. 1.

FIG. 1 is a perspective view of an OLED display 100 according to a first exemplary embodiment and FIG. 2 is a partially enlarged cross-sectional view of the OLED display taken along the line II-II of FIG. 1.

Referring to FIG. 1, the OLED display 100 includes a substrate 110 including a display area DA and a non-display area NDA, a plurality of pixels PXs formed in the display area DA on the substrate 110, an encapsulation substrate 120 formed to be opposite to the substrate 110, and a filler 130 filling a space between the substrate 110 and the encapsulation substrate 120. The substrate 110 and the encapsulation substrate 120 are bonded to each other to be integrally sealed with a sealant 140.

In the display area DA, an image is displayed by a combination of light emitted from the pixels PXs. Each pixel PX includes a driving circuit unit or driving circuit and an OLED. The driving circuit unit includes at least two thin film transistors and at least one capacitor. A pixel defining layer 115 which defines an emission area of the OLED is formed on the substrate 110. The pixel defining layer 115 can be larger than the display area DA.

The OLED display 100 includes a first passivation layer 161 covering a surface of the pixel defining layer 115 in the non-display area NDA and a second passivation layer 162 contacting the first passivation layer 161 and formed outside the pixel defining layer 115. The filler 130 contacts the first passivation layer 161 and the second passivation layer 162 in the non-display area NDA.

The first and second passivation layers 161 and 162 block the pixel defining layer 115 and the planarization layer 114 from contacting the filler 130 to prevent various impurities or oxygen included in the filler 130 from diffusing into the pixel defining layer 115 and the planarization layer 114. Therefore, it is possible to suppress the defects, such as the deterioration in the OLED and the pixel contraction, due to the filler 130.

Hereinafter, a cross section structure of the OLED display 100 will be described in more detail.

A buffer layer 111 is formed on the substrate 110. The substrate 110 may be formed of glass, quartz, ceramic, polymer film, and the like and may have light transparency. The buffer layer 111 may have a single layer which is made of silicon nitride (SiNx) or a double layer which is made of silicon nitride (SiNx) and silicon oxide $SiO_2$. The buffer layer 111 serves to planarize a surface while preventing permeation of impurities through the substrate 110.

A semiconductor layer 151 may be formed on the buffer layer 111. The semiconductor layer 151 may be made of a polysilicon or an oxide semiconductor and the semiconductor layer 151 which is made of the oxide semiconductor may be covered with a separate passivation layer. The semiconductor layer 151 includes a channel region which is not doped with impurity and a source region and a drain region which are positioned at both sides of the channel region and are doped with impurity.

A gate insulating layer 112 is formed on the semiconductor layer 151. The gate insulating layer 112 may be formed of a single layer of silicon nitride (SiNx) or silicon oxide $SiO_2$ or a stacked layer thereof. A gate electrode 152 is formed on the gate insulating layer 112. The gate electrode 152 overlaps the channel region of the semiconductor layer 151 and may include Au, Ag, Cu, Ni, Pt, Pd, Al, Mo, and the like.

An interlayer insulating layer 113 is formed on the gate electrode 152. The interlayer insulating layer 113 may be formed of a single layer of silicon nitride (SiNx) or silicon oxide $SiO_2$ or a stacked layer thereof.

A source electrode 153 and a drain electrode 154 are formed on the interlayer insulating layer 113. The source electrode 153 and the drain electrode 154 are each connected to the source region and the drain region of the semiconductor layer 151 through the via holes which are formed on the interlayer insulating layer 113 and the gate insulating layer 112. The source electrode 153 and the drain electrode 154 may be formed of a metal multilayer film such as Mo/Al/Mo and Ti/Al/Ti.

FIG. 2 illustrates, for example, the driving thin film transistor (TFT) of a top gate type, but the structure of the driving thin film transistor (TFT) is not limited to the illustrated example. The driving circuit unit includes a switching thin film transistor, a driving thin film transistor, and a storage capacitor and for convenience, FIG. 2 illustrates only the driving thin film transistor (TFT).

The driving thin film transistor (TFT) is covered with a planarization layer 114 and is connected to the OLED to drive the OLED. A pixel electrode 155 is formed on the planarization layer 114. The pixel electrode 155 is formed in each pixel one by one and is connected to the drain electrode 154 of the driving thin film transistor (TFT) via the via holes which are formed on the planarization layer 114.

The pixel defining layer 115 is formed on the planarization layer 114 and the pixel electrode 155. The pixel defining layer 115 forms an opening OP to expose a central portion of the pixel electrode 155 on which the emission layer 156 will be positioned. That is, the opening OP serves to define the emission area of the OLED.

The pixel defining layer 115 may be made of relatively inexpensive silicon-based polymer which replaces expensive photosensitive polyimide. Further, the planarization layer 114 may also be made of the same silicon-based polymer as the pixel defining layer 115. This reduces the cost of materials which contributes in reducing the costs of the OLED display 100.

The emission layer 156 is formed on the pixel electrode 155 and the common electrode 156 is formed on the emission layer 156 and the pixel defining layer 115. The common electrode 157 is formed in the whole display area (DA) without being differentiated for each pixel. Any one of the pixel electrode 155 and the common electrode 157 injects holes into the emission layer 156 and the other thereof injects electrons into the emission layer 156.

The emission layer 156 includes an organic emission layer and includes at least one of a hole injection layer, a hole transportation layer, an electron transportation layer, and an electron injection layer. When the pixel electrode 155 is an anode injecting holes, a hole injection layer, a hole transport layer, an organic emission layer, an electron transport layer, and an electron injection layer may be sequentially stacked on the pixel electrode 155. The rest of the layers other than the organic emission layer may be formed over the whole of the display area DA.

When the OLED display 100 is a bottom emission type, the pixel electrode 155 is formed of the transparent layer or the translucent layer and the common electrode 157 is formed of the reflecting layer. The light emitted from the emission layer 156 is reflected from the common electrode 157 and transmits the pixel electrode 155 and the substrate 110 to be emitted to the outside. When the pixel electrode 155 is formed of the translucent layer, a portion of the light emitted from the common electrode 157 is again reflected from the pixel electrode 155, and the pixel electrode 155 and the common electrode 157 form a resonance structure to increase light extraction efficiency.

When the OLED display 100 is a top emission type, the pixel electrode 155 is formed of a reflecting layer and the common electrode 157 is formed of a transparent layer or a translucent layer.

The reflecting layer may include Au, Ag, Mg, Al, Pt, Pd, Ni, Nd, Ir, Cr, and the like. The transparent layer may include indium tin oxide (ITO), indium zinc oxide (IZO), ZnO, $In_2O_3$, and the like. The translucent layer may be formed of a metal thin layer including Li, Ca, LiF/Ca, LiF/Al, Al, Ag, Mg, and the like and may be formed of a stacked layer of the metal thin layer and the transparent layer. For example, the translucent layer may be formed of a multilayer of ITO/Ag/ITO.

The substrate 110 and the encapsulation substrate 120 are bonded to each other by a sealant 140. The sealant 140 is formed at edges of the substrate 110 and the encapsulation substrate 120 and may include inorganic materials such as glass fit or organic materials such as epoxy. Inside of the sealant may be formed with a getter 145. The getter 145 serves to adsorb moisture or oxygen permeated through the sealant 140 and may include CaO, BaO, MgO, and the like having excellent reactivity with moisture or oxygen.

A space between the substrate 110 and the encapsulation substrate 120 inside of the getter 145 is filled with the filler 130. The filler 130 fills an empty space between the substrate 110 and the encapsulation substrate 120 to serve to increase stiffness of the OLED display 100. That is, the OLED display 100 including the filler 130 has improved durability against external impact, for example, dropping. The filler 130 may be a transparent isotropic material and may include transparent silicon-based polymer.

The buffer layer 111, the gate insulating layer 112, and the interlayer insulating layer 113 may be formed as the same size as the substrate 110 and the planarization layer 114 may be formed to be smaller than the interlayer insulating layer 113 so that the edge of the planarization layer overlaps the getter 145 on the plane. Further, an end of the pixel defining layer 115 may be positioned between the edge of the display area DA and the edge of the filler 130 on the plane. The edge of the pixel defining layer 115 is spaced apart from the getter 145 at a predetermined distance.

In the pixel defining layer 115, the surface of the portion formed in the display area DA is covered with the common electrode 157 and the surface of the portion formed in the non-display area NDA is covered with the first passivation layer 161. The first passivation layer 161 covers both an upper surface and a side of the pixel defining layer 115.

Further, the second passivation layer 162 contacts the first passivation layer 161 and is formed outside the pixel defining layer 115.

Both of the first passivation layer 161 and the second passivation layer 162 are formed in the non-display area NDA and may include metal, an inorganic material, or an organic material into which the material of the filler 130 is not diffused.

The first passivation layer 161 may be made of the same material as the common electrode 157. The first passivation layer 161 may be integrally formed with the common electrode 157, while contacting the common electrode 157. For example, the common electrode 157 and the first passivation layer 161 may be simultaneously formed by enlarging an opening size of an open mask used at the time of depositing the common electrode 157.

The second passivation layer 162 is formed between the planarization layer 114 and the filler 130, outside of the pixel defining layer 115. Both ends of the second passivation layer 162 may overlap the pixel defining layer 115 and the getter 145. That is, the second passivation layer 162 may include one end overlapping the pixel defining layer 115, a central portion overlapping the filler 130, and the other end overlapping the getter 145.

The second passivation layer 162 may be made of the same material as the pixel electrode 155 and may be simultaneously formed with the pixel electrode 155. For example, the common electrode 155 and the second passivation layer 162 may be simultaneously formed by adding the opening size to a deposition mask used at the time of depositing the common electrode 155. Therefore, a separate deposition mask for forming the second passivation layer 162 is not required and a manufacturing process for forming the second passivation layer 162 is not added.

When the pixel electrode 155 is formed of the translucent layer, the second passivation layer 162 may be formed of a multilayer of a first transparent layer 1621, a metal thin layer 1622, and a second transparent layer 1623, for example, a multilayer of ITO/Ag/ITO. The first transparent layer 1621 has excellent adhesion with the planarization layer 114 and the second transparent layer 1623 has excellent adhesion with the filler 130. Therefore, the second passivation layer 162 may be firmly formed between the planarization layer 114 and the filler 130 without defects such as lifting and delamination.

By the foregoing configuration, the filler 130 contacts the first and second passivation layers 161 and 162 in the non-display area NDA and does not contact the pixel defining layer 115 and the planarization layer 114. The pixel defining layer 115, the planarization layer 114, and the filler 130 all may be made of silicon-based polymer and when the filler 130 contacts the pixel defining layer 115 and the planarization layer 114 including the same-based polymer, the material is easily diffused.

For example, if it is assumed that the pixel defining layer 115 is formed to be wider than the filler 130 to contact the getter 145, the surface of the pixel defining layer 115 which is not covered with the common electrode 157 in the non-display area NDA contacts the filler 130. Further, if it is assumed that no second passivation layer 162 is present in the structure of FIG. 2, the filler 130 contacts the planarization layer 114.

In this case, various impurities, oxygen, or the like which is included in the filler 130 is easily diffused into the pixel defining layer 115 and the planarization layer 114. Further, the impurities or the oxygen which is diffused into the pixel defining layer 115 and the planarization layer 114 is permeated into the OLED to cause the deterioration in the OLED and defects such as pixel contraction.

However, according to some embodiments, the pixel defining layer 115 and the planarization layer 114 do not contact the filler 130 by the first passivation layer 161 and the second passivation layer 162 and therefore the diffusion of the material from the filler 130 into the pixel defining layer 115 and the planarization layer 114 may be prevented. Therefore, according to the OLED display 100 according to the first exemplary embodiment, it is possible to suppress defects, such as the deterioration in the OLED and the pixel contraction, due to the filler 130.

Meanwhile, a wiring 170 for supplying an electrical signal to the pixels PXs may be positioned in the non-display area NDA. The wiring 170 may include a first metal layer 171 formed on the gate insulating layer 112 and a second metal layer 172 contacting the first metal layer 171 by the opening formed on the interlayer insulating layer 113. The first metal layer 171 may be made of the same material as the gate electrode 152 and the second metal layer 172 may be made of the same material as the source electrode 153 and drain electrode 154.

The second metal layer 172 may include an end 172a protruding from the insulating layer 113 in the area overlapping the getter 145

The third passivation layer 163 may be formed on the edge of the planarization layer 114 into the getter 114. The third passivation layer 163 prevents the defects such as lifting or delamination of the second metal layer 172 and the planarization layer 114 due to the protruding end 172a of the second metal layer 172. The third passivation layer 163 may be made of the same material as the pixel defining layer 115, simultaneously formed with the pixel defining layer 115.

Figure 3:
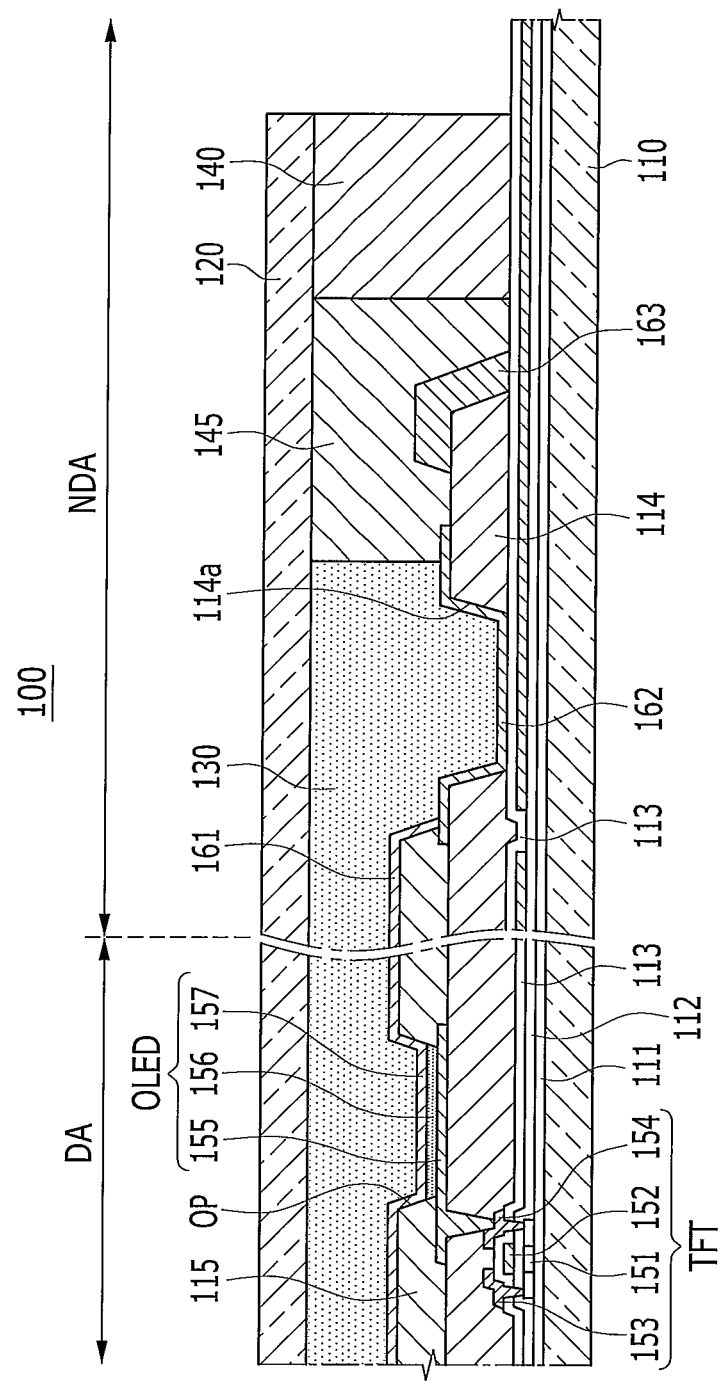
FIG. 3 is a partially enlarged cross-sectional view of the OLED display taken along the line of FIG. 1.

FIG. 3 is a partially enlarged cross-sectional view of the OLED display taken along the line of FIG. 1.

Referring to FIG. 3, the opening 114a may be formed on the planarization layer 114, if necessary, in the portion which does not overlap the wiring in the non-display area NDA. The surface of the interlayer insulating layer 113 is exposed by the opening 114a of the planarization layer 114 and the second passivation layer 162 is formed on the side wall of the planarization layer 114 enclosing the opening 114a and over the exposed interlayer insulating layer 113.

The second passivation layer 162 made of the same material as the pixel electrode 155 has excellent adhesion with the interlayer insulating layer 113 and the filler 130. Therefore, it is possible to suppress defects such as lifting or delamination of the interlayer insulating layer 113 exposed by the opening 114a of the planarization layer 114.

Figure 4:
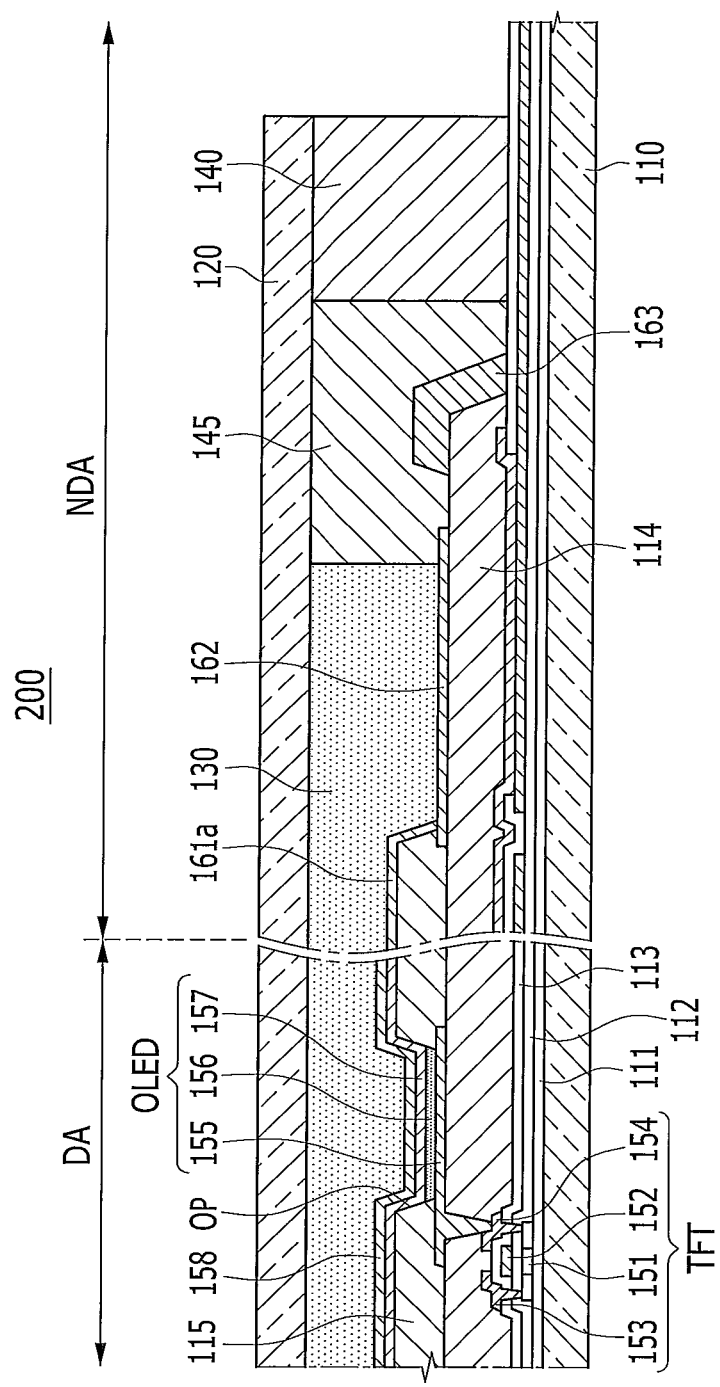
FIG. 4 is an enlarged cross-sectional view of an OLED display according to a second exemplary embodiment.

FIG. 4 is an enlarged cross-sectional view of an OLED display 200 according to a second exemplary embodiment.

Referring to FIG. 4, the OLED display 200 includes a capping layer 158 formed on the common electrode 157 and is made of the same material as a first passivation layer 161a and the capping layer 158. The first passivation layer 161a may be integrally formed with the capping layer 158, while contacting the capping layer 158.

The capping layer 158 protects the OLED display and when the OLED display 200 is the top emission type, serves to optimize the light efficiency by refractive index matching. The capping layer 158 may include organic materials such as Alq3(tris (8-hydroxyquinoline) aluminum), α-NPD(N,N'-bis-(naphthalene-1-yl)-N,N'-bis(phenyl)benzidine), NPB(N,N'-Bis-(1-naphthyl)-N,N-Diphenyl-1,1-Biphenyl-4-4'-Di-amine), or CuPc(Copper Phthalocyanine).

The rest of the components other than the capping layer 158 and the first passivation layer 161a are the same as the first exemplary embodiment as described above.

Figure 5:
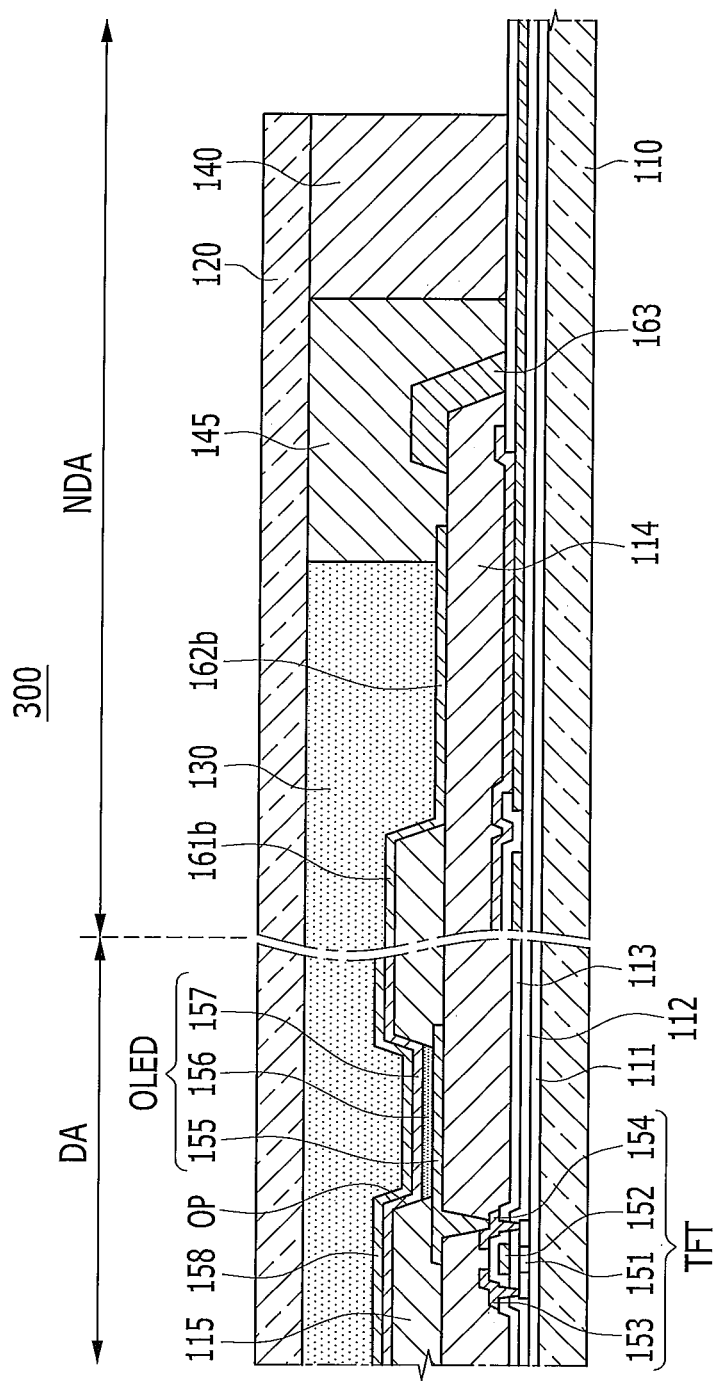
FIG. 5 is an enlarged cross-sectional view of an OLED display according to a third exemplary embodiment.

FIG. 5 is an enlarged cross-sectional view of an OLED display 300 according to a third exemplary embodiment.

Referring to FIG. 5, the OLED display 300 includes the capping layer 158 formed on the common electrode 157 and a first passivation layer 161b and a second passivation layer 162b are made of the same material as the capping layer 158. The first passivation layer 161b may be integrally formed with the capping layer 158 while contacting the capping layer 158 and the second passivation layer 162b may be integrally formed with the first passivation layer 161b while contacting the first passivation layer 161b. That is, the capping layer 158, the first passivation layer 161b, and the second passivation layer 16b may be formed of a single layer.

The rest of the components other than the capping layer 158, the first passivation layer 161b, and the second passivation layer 162b are the same as the first exemplary embodiment as described above.

While the inventive technology has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, including:
   a substrate including a display area in which an OLED is formed and a non-display area surrounding the display area;
   a pixel defining layer disposed over the substrate and having an opening defining an emission area of the OLED;
   a first passivation layer covering a portion of the pixel defining layer disposed in the non-display area;
   a second passivation layer disposed in the non-display area;
   an encapsulation substrate disposed to be opposite to the substrate;
   a filler filling a space between the substrate and the encapsulation substrate and contacting the first and second passivation layers,
   wherein the second passivation layer does not overlap an emission layer of the OLED of the display area,
   wherein the first passivation layer and the second passivation layer are separated from each other, in part, by the pixel defining layer, and
   wherein the first passivation layer covers a portion of an upper surface of the second passivation layer in the non-display area, a first portion of the second passivation layer is disposed under the pixel defining layer and contacts a lower surface of the pixel defining layer in the non-display area, and the first passivation layer overlaps the first portion of the second passivation layer.

2. The OLED display of claim 1, wherein an end of the pixel defining layer is positioned between an edge of the display area and an edge of the filler on a plane.

3. The OLED display of claim 2, wherein the second passivation layer contacts the first passivation layer.

4. The OLED display of claim 3, further comprising: a planarization layer disposed below the pixel defining layer and the second passivation layer, wherein the second passivation layer covers substantially the entire surface of the planarization layer outside the pixel defining layer.

5. The OLED display of claim 4, wherein each of the pixel defining layer, the first passivation layer, and the second passivation layer is formed of silicon-based polymer.

6. The OLED display of claim 4, wherein the planarization layer forms an opening to expose an interlayer insulating layer disposed below the planarization layer and wherein the second passivation layer covers the exposed interlayer insulating layer.

7. The OLED display of claim 1, wherein the OLED includes a pixel electrode, an emission layer, and a common electrode and is covered with a capping layer.

8. The OLED display of claim 7, wherein the first passivation layer contacts the common electrode and is formed of the same material as the common electrode.

9. The OLED display of claim 8, wherein the second passivation layer contacts the first passivation layer and is formed of the same material as the pixel electrode.

10. The OLED display of claim 9, wherein the second passivation layer is formed of a multilayer of a first transparent layer, a metal thin layer, and a second transparent layer.

11. The OLED display of claim 7, Wherein the first passivation layer contacts the capping layer and is formed of the same material as the capping layer.

12. The OLED display of claim 11, wherein the second passivation layer contacts the first passivation layer and is formed of the same material as the pixel electrode.

13. The OLED display of claim 12, wherein the second passivation layer is formed of a multilayer of a first transparent layer, a metal thin layer, and second transparent layer.

14. The OLED display of claim 7, wherein the first passivation layer contacts the capping layer and is formed of the same material as the capping layer and wherein the second passivation layer contacts the first passivation layer and is formed of the same material as the capping layer.

15. The OLED display of claim 1, wherein the first and second passivation layers are disposed on different layers.

16. The OLED display of claim 1, wherein the first passivation layer is disposed above the second passivation layer.

17. An organic light-emitting diode (OLED) display, including:
   an OLED disposed in a display area;
   a pixel defining layer including a first portion disposed in the display area and a second portion disposed in a non-display area surrounding the display area;
   a first passivation layer covering at least the second portion of the pixel defining layer;
   a second passivation layer disposed in the non-display area, wherein the second passivation layer directly contacts a portion of the first passivation layer and part of the second portion of the pixel defining layer;
   a filler covering the first and second passivation layers; and
   a planarization layer disposed below the pixel defining layer and the second passivation layer,
   wherein the second passivation layer does not overlap an emission layer of the OLED display device,
   wherein the planarization layer has an opening exposing an interlayer insulating layer disposed below the planarization layer,
   wherein the second passivation layer directly contacts and covers the exposed interlayer insulating layer and sidewalls of the opening of the planarization layer, and wherein the first passivation layer covers a second portion of an upper surface of the second passivation layer in the non-display area, the second passivation layer is disposed under the pixel defining layer and contacts a lower surface of the pixel defining layer in the non-display area, and the first passivation layer overlaps the second passivation layer disposed under the pixel defining layer in the non-display area.

18. The OLED display of claim 17, wherein the second passivation layer includes a portion that does not overlap the first passivation layer in the depth dimension of the OLED display.

19. The OILED display of claim 17, wherein the first passivation layer includes a non-linear portion, and wherein the second passivation layer is substantially linear.

20. The OLED display of claim 17, wherein the first and second passivation layers are disposed on different layers.

21. The OLED display of claim 17, wherein the first passivation layer is farther from the substrate than the second passivation layer.

22. The OLED display of claim 17, wherein the filler directly contacts top surfaces of the first and second passivation layers that face the encapsulation substrate.

* * * * *